United States Patent
Mao et al.

(10) Patent No.: US 12,191,114 B2
(45) Date of Patent: Jan. 7, 2025

(54) SEMICONDUCTOR REACTION CHAMBER AND ATOMIC LAYER PLASMA ETCHING APPARATUS

(71) Applicant: BEIJING NAURA MICROELECTRONICS EQUIPMENT CO., LTD., Beijing (CN)

(72) Inventors: Xingfei Mao, Beijing (CN); Masaya Odagiri, Beijing (CN); Gang Wei, Beijing (CN); Guodong Chen, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 113 days.

(21) Appl. No.: 17/924,342

(22) PCT Filed: May 7, 2021

(86) PCT No.: PCT/CN2021/092080
§ 371 (c)(1),
(2) Date: Nov. 9, 2022

(87) PCT Pub. No.: WO2021/227943
PCT Pub. Date: Nov. 18, 2021

(65) Prior Publication Data
US 2023/0187173 A1    Jun. 15, 2023

(30) Foreign Application Priority Data
May 9, 2020 (CN) .......... 202010387430.9

(51) Int. Cl.
*H01J 37/00* (2006.01)
*H01J 37/32* (2006.01)
*H01L 21/67* (2006.01)

(52) U.S. Cl.
CPC ... *H01J 37/32119* (2013.01); *H01J 37/32357* (2013.01); *H01J 37/32449* (2013.01); *H01J 2237/334* (2013.01); *H01L 21/67069* (2013.01)

(58) Field of Classification Search
CPC .......... H01J 37/32119; H01J 37/32449; H01J 37/3244; H01J 37/32357; H01L 21/67069
See application file for complete search history.

(56) References Cited

U.S. PATENT DOCUMENTS 11,276,559 B2 *   3/2022   Samir ............... H01J 37/32082
11,929,251 B2 *   3/2024   Nozawa .............. H01J 37/3244
(Continued)

FOREIGN PATENT DOCUMENTS

CN    102204415 A    9/2011
CN    107017047 A    8/2017
(Continued)

OTHER PUBLICATIONS

The World Intellectual Property Organization (WIPO) International Search Report for PCT/CN2021/092080 Jul. 22, 2021 5 Pages (including translation).

*Primary Examiner* — Tuan T Lam
(74) *Attorney, Agent, or Firm* — ANOVA LAW GROUP, PLLC

(57) ABSTRACT

The present disclosure provides a semiconductor reaction chamber and an atomic layer plasma etching apparatus. The semiconductor reaction chamber includes a dielectric window and a reaction chamber body. The spray head is arranged between the dielectric window and the top wall of the reaction chamber body, and divides the plasma generation area into an upper strong plasma area and a lower weak (Continued)

plasma area. Moreover, a plurality of through-holes are distributed in the central area of the spray head and configured to allow the plasma in the strong plasma area to pass through. A first gas channel is arranged in an edge area of the spray head. The process reaction gas inlet member is located on a side where the gas inlet end of the first gas channel of the spray head is located. A second gas channel is arranged in the process reaction gas inlet member.

20 Claims, 11 Drawing Sheets

(56) References Cited

U.S. PATENT DOCUMENTS

| | | |
|---|---|---|
| 2006/0096540 A1 | 5/2006 | Choi |
| 2011/0174606 A1 | 7/2011 | Funk et al. |
| 2015/0226540 A1* | 8/2015 | Rajagopalan ....... C23C 16/5096 356/402 |
| 2017/0200568 A1 | 7/2017 | Kawaguchi |
| 2017/0330728 A1* | 11/2017 | Bravo ............... H01J 37/32082 |
| 2019/0341275 A1* | 11/2019 | Jin ........................ B08B 7/0035 |
| 2024/0043993 A1* | 2/2024 | Akae ..................... C23C 16/455 |

FOREIGN PATENT DOCUMENTS

| | | |
|---|---|---|
| CN | 107086169 A | 8/2017 |
| CN | 107452590 A | 12/2017 |
| CN | 109155242 A | 1/2019 |
| CN | 111599717 A | 8/2020 |
| JP | 2014107405 A | 6/2014 |
| JP | 2014523635 A | 9/2014 |
| JP | 2017175121 A | 9/2017 |
| TW | 201300570 A | 1/2013 |
| TW | 201714237 A | 4/2017 |
| TW | 201805470 A | 2/2018 |
| WO | 2010058642 A1 | 5/2010 |
| WO | 2011080876 A1 | 7/2011 |

* cited by examiner

SEMICONDUCTOR REACTION CHAMBER AND ATOMIC LAYER PLASMA ETCHING APPARATUS

CROSS-REFERENCES TO RELATED APPLICATIONS

This application is a national phase entry under 35 U.S.C. § 371 of International Application No. PCT/CN2021/092080, filed on May 7, 2021, which claims priority to Chinese Application No. 202010387430.9 filed on May 9, 2020, the entire content of all of which are incorporated herein by reference.

TECHNICAL FIELD

The present disclosure generally belongs to the semiconductor manufacturing field and relates to an atomic layer plasma etching technology and, more particularly, to a semiconductor reaction chamber and an atomic layer plasma etching apparatus.

BACKGROUND

Etching is an essential step in the chip manufacturing process field and includes primarily removing material from a wafer to form a patterned feature. A plasma etching technology is widely used in the chip manufacturing process. Generally, after a process gas enters a reaction chamber, the process gas is excited by radio frequency power to be ionized to form a plasma. The plasma produces physical and chemical reactions with a surface of an etched material to form a volatile reaction product. The reaction product is separated from the surface of the etched material and is sucked out of the reaction chamber by a vacuum system.

The plasma etching technology is realized by relying on a plasma etching apparatus. Before etching, the reaction chamber of the plasma etching apparatus is in a vacuum state, and a to-be-processed wafer is placed on a lower electrode. When the etching process starts, the wafer is adsorbed by the lower electrode. The process gas is injected into the reaction chamber through a nozzle located at a center of a dielectric window. An upper electrode is loaded with a high-frequency power supply to ionize the process gas in the reaction chamber to form a plasma to complete the etching process of the wafer after exposure of a pattern mask.

However, the existing plasma etching apparatus is configured to mix the plasma generation gas (such as argon) and the process reaction gas (such as chlorine) into a same channel, which makes it difficult to precisely and quickly control the gas injection, and the formed plasma energy density is high, which is easy to form an overreaction, affects the fine etching of the wafer pattern. For processing a tiny structure with little or no space, when the plasma bombards the wafer, the tiny structure may be damaged on the wafer.

SUMMARY

To solve the problems in the existing technology, embodiments of the present disclosure provide a semiconductor reaction chamber, which comprising:

a dielectric window and a reaction chamber body, the dielectric window being arranged above the reaction chamber body, and a plasma generation area being located below the dielectric window;

a spray head arranged between the dielectric window and a top wall of the reaction chamber body and dividing the plasma generation area into an strong plasma area at an upper part and a weak plasma area at a lower part, a plurality of through-holes being distributed in a central area of the spray head and configured to allow a plasma in the strong plasma area to pass through, an edge area of the spray head being provided with a first gas channel, and a gas outlet end of the first gas channel being communicated with the weak plasma area; and a process reaction gas inlet member located on a side where a gas inlet end of the first gas channel of the spray head is located, a second gas channel being arranged in the process reaction gas inlet member, and the second gas channel being configured to introduce a process reaction gas into the first gas channel.

In some embodiments, the first gas channel includes a plurality of gas holes arranged at intervals along a circumferential direction of the spray head; and the process reaction gas inlet member is a gas distribution and support ring, at least a part of the gas distribution and support ring being stacked on an upper surface of the spray head, and a plurality of gas outlet ends of the second gas channel being provided, located on a surface of the gas distribution and support ring that contacts with the upper surface of the spray head, and communicated with gas inlet ends of the plurality of gas holes in a one-to-one correspondence.

In some embodiments, the second gas channel has one gas inlet end, which is located on an upper surface of the gas distribution and the support ring;

the second gas channel includes a plurality of arc-shaped sub-gas channel groups that are concentric with the gas distribution and the support ring and have different radii, and a plurality of lower outlets, the plurality of the arc-shaped sub-gas channel groups being communicated in sequence. In two communicated arc-shaped sub-gas channel groups, a number of arc-shaped sub-gas channels of a downstream arc-shaped sub-gas channel group being two times of a number of the arc-shaped sub-gas channels of an upstream arc-shaped sub-gas channel group; and a number of gas outlet ends of arc-shaped sub-gas channels of a most downstream arc-shaped sub-gas channel group is the same as a number of the gas holes, the gas outlet ends being communicated with the gas holes in a one-to-one correspondence through the lower outlets.

In some embodiments, three arc-shaped sub-gas channel groups are included and include a first arc-shaped sub-gas channel group, a second circular arc-shaped sub-gas channel group, and a third circular arc-shaped sub-gas channel group in a gas inlet direction, and a radius of the third arc-shaped sub-gas channel group is larger than a radius of the second arc-shaped sub-gas channel group and smaller than a radius of the first arc-shaped sub-gas channel group; and the first arc-shaped sub-gas channel group includes one arc-shaped sub-air channel, the second arc-shaped sub-channel group includes two arc-shaped sub-gas channels that are center symmetrical, the third arc-shaped sub-gas channel group includes four arc-shaped sub-gas channels that are center symmetrical, each of the arc-shaped sub-gas channels includes one gas inlet end that is located in a middle position, and each of the arc-shaped sub-gas channels includes two gas outlet ends that are located at two ends.

In some embodiments, the semiconductor reaction chamber further includes:

a gas distribution ring arranged around below the spray head, a plurality of third gas channels being arranged in the gas distribution ring at intervals along a circumferential direction of the gas distribution ring, gas inlet ends of the third gas channels being communicated with the gas outlet ends of the gas holes in a one-to-one correspondence, and the gas outlet ends of the gas holes being communicated with the weak plasma area through the third gas channels.

In some embodiments, a gas inlet end of each of the third gas channels is located on an upper surface of the gas distribution ring, and a gas outlet end of each of the third gas channels is located on an inner sidewall of the gas distribution ring; and a gas outlet direction of the gas outlet end of each of the third gas channels is perpendicular to an axial direction of the reaction chamber body or forms a predetermined angle with the axial direction of the reaction chamber body.

In some embodiments, the spray head includes a circular plane member and an annular member connected to the spray head and surrounding the circular plane member, wherein a plurality of through-holes are evenly distributed in the circular plane member, and a plurality of gas holes are distributed at intervals along a circumferential direction of the annular member.

In some embodiments, a plurality of circular plane members are included and stacked with each other.

In some embodiments, a thickness of the annular member is greater than a thickness of the circular plane member, a lower surface of the annular member is flush with a lower surface of the circular plane member, the annular member is located on an inner side of the reaction chamber body, an annular flange is arranged around an outer peripheral wall of the annular member, the annular flange is stacked on a top of the reaction chamber body, a gas inlet end of each of the gas holes is located on an upper surface of the annular flange, and a gas outlet end of each of the gas holes is located on a lower surface of the annular member; and the gas distribution ring is located on the inner side of the reaction chamber body and stacked on the lower surface of the annular member.

In some embodiments, a diameter of the through-hole ranges from φ1 mm to φ10 mm. A porosity of the circular plane member ranges from 10% to 80%; and a diameter of the gas hole ranges from φ1 mm to φ8 mm.

An atomic layer plasma etching apparatus comprising a semiconductor reaction chamber, an upper radio frequency system, and a lower radio frequency system, wherein the semiconductor reaction chamber is the semiconductor reaction chamber of embodiments of the present disclosure, wherein, a base configured to carry the wafer that is arranged in the semiconductor reaction chamber, the semiconductor reaction chamber includes the reaction chamber body, the process reaction gas inlet member and the dielectric window that are stacked on a top of the reaction chamber body in sequence along a direction away from the reaction chamber body, a center nozzle system is arranged on the dielectric window and configured to introduce a plasma generation gas into the plasma generation area, the upper radio frequency system is arranged above the dielectric window and configured to excite the plasma generation gas to form the plasma, and the lower radio frequency system is electrically connected to the base and configured to load bias voltage power.

In the semiconductor reaction chamber provided by embodiments of the present disclosure, the plasma generation area can be divided into the strong plasma area at the upper part and the weak plasma area at the lower part through the spray head. The plurality of through-holes that are distributed in the central area of the spray head can reduce the energy of the plasma entering the through-holes from the strong plasma area. Thus, the plasma entering the weak plasma area may be the low-energy density plasma, which can provide the low-energy plasma source for the plasma etching or atomic layer etching to reduce the plasma damage. Especially, when processing microstructures with little or no space, the microstructures on the wafer may be prevented from being damaged. In addition, with the aid of the first gas channel in the edge area of the spray head and the second gas channel in the process reaction gas inlet member, an input channel configured to introduce the process reaction gas into the weak plasma area alone can be formed. Thus, the rapid and precise control and input of the gas may be realized to satisfy the gas rapid control requirements of the atomic layer etching process.

The atomic layer plasma etching apparatus of embodiments of the present disclosure, by using the above-mentioned semiconductor reaction chamber of embodiments of the present disclosure, can provide the low-energy plasma source, reduce the plasma damage, and realize the rapid and precise control and input of the gas to meet the gas rapid control requirement of the atomic layer etching process.

BRIEF DESCRIPTION OF THE DRAWINGS

The above and other objects, features, and advantages of the present disclosure will become more apparent by performing a more detailed description of exemplary embodiments of the present disclosure in connection with the accompanying drawings. Same reference numerals generally represent same parts in exemplary embodiments of the present disclosure.

DETAILED DESCRIPTION OF THE EMBODIMENTS

Preferred embodiments of the present disclosure will be described in more detail below with reference to the accompanying drawings. Although preferred embodiments of the present disclosure are shown in the accompanying drawings, it should be understood that the present disclosure may be implemented in various forms and should not be limited by embodiments of the present disclosure. On the contrary, these embodiments are provided to make the present disclosure thorough and complete and to fully convey the scope of the disclosure to those skilled in the art.

Figure 1:
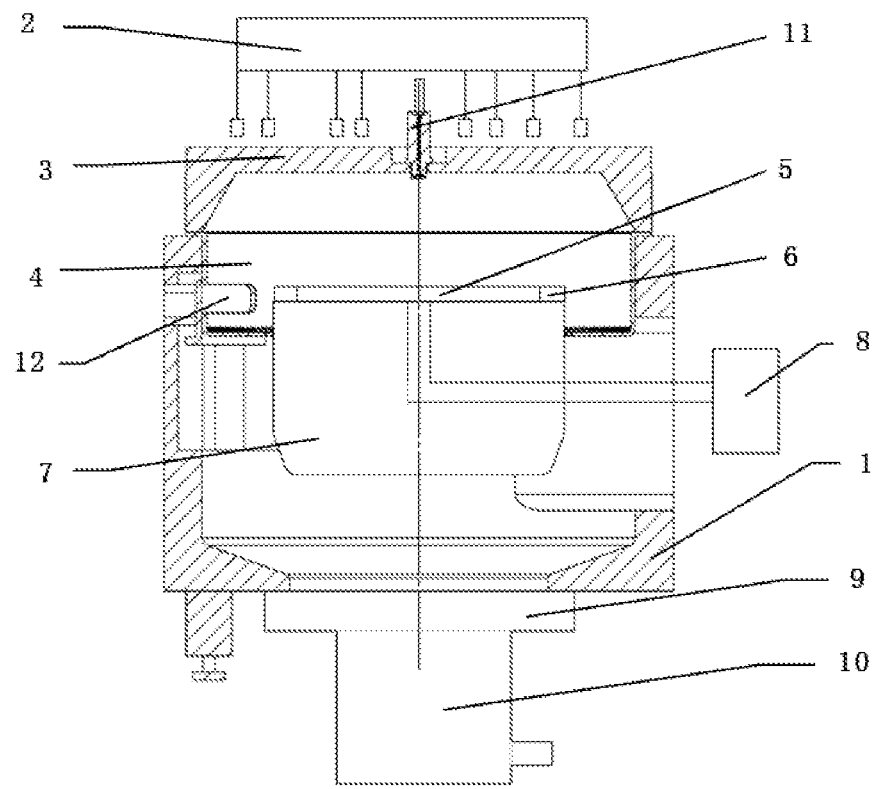
FIG. 1 is a schematic structural diagram of an existing inductive coupled plasma (ICP) etching apparatus magnetron mechanism.

As shown in FIG. 1, an existing inductive coupled plasma (ICP) etching apparatus mainly includes a chamber body 1, an upper radio frequency system 2, a dielectric window 3, a liner 4, and an electrostatic chuck 5, a focus ring 6, an electrostatic chuck base 7, a lower radio frequency system 8, a pressure control valve 9, a vacuum system 10, a process gas nozzle 11, and a wafer transfer gap 12.

The dielectric window 3 is arranged on a top of the chamber body 1. The electrostatic chuck 5 is arranged in the chamber body 1 and placed on the electrostatic chuck base 7 to carry the wafer. An area between the dielectric window 3 and the electrostatic chucks 5 is a plasma generation area. The process gas nozzle 11 is arranged on the dielectric window 3 and configured to transfer the process gas to the above-mentioned plasma generation area. The upper radio frequency system 2 is arranged above the dielectric window 3 and configured to excite the process gas to form the plasma. The lower radio frequency system 8 is electrically connected to the electrostatic chuck 5 and configured to apply a bias power to the electrostatic chuck 5. In addition, the focus ring 6 is arranged around the electrostatic chuck 5. The liner 4 is arranged around the above-mentioned plasma area of the chamber body 1. The vacuum system 10 is evacuated through an outlet from the lower part of the chamber body 1.

However, the existing plasma etching apparatus is configured to mix the plasma generation gas (such as argon) and the process reaction gas (such as chlorine) into a same channel, which makes it difficult to precisely and quickly control the gas injection, and the formed plasma energy density is high, which is easy to form an overreaction, affects the fine etching of the wafer pattern. For processing a tiny structure with little or no space, when the plasma bombards the wafer, the tiny structure may be damaged on the wafer.

Figure 2:
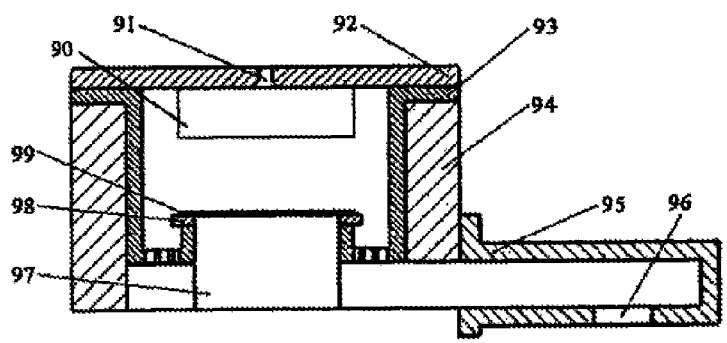
FIG. 2 is a schematic structural diagram of a plasma etching apparatus.

FIG. 2 is a schematic structural diagram of a plasma etching apparatus. With reference to FIG. 2, the apparatus includes a reaction chamber 94. A quartz cover 92 is arranged above the reaction chamber 94. A gas inlet nozzle mounting hole 91 is arranged at an approximate center of the quartz cover 92. A gas inlet nozzle mounted here may be configured to inject the process gas outside the reaction chamber 94 into the gas distribution chamber 90 located at a lower part of the reaction chamber 94. In addition, an electrostatic chuck 97 is arranged in the reaction chamber 94 and configured to adsorb and fix the wafer 99. A focus ring 98 is arranged around the electrostatic chuck 97 and configured to protect the lower electrode part from being bombarded by the plasma. A liner 93 is arranged around an inner wall of the reaction chamber 94 and configured to prevent the inner wall of the reaction chamber 94 from being contaminated by the etching reaction product. In addition, a plurality of small holes are arranged at a bottom of the liner 93 and configured to transfer the reaction product in the reaction chamber 94 to the gas extraction chamber 95 and discharge the reaction product from the gas outlet 96 of the gas extraction chamber 95.

Figure 3:
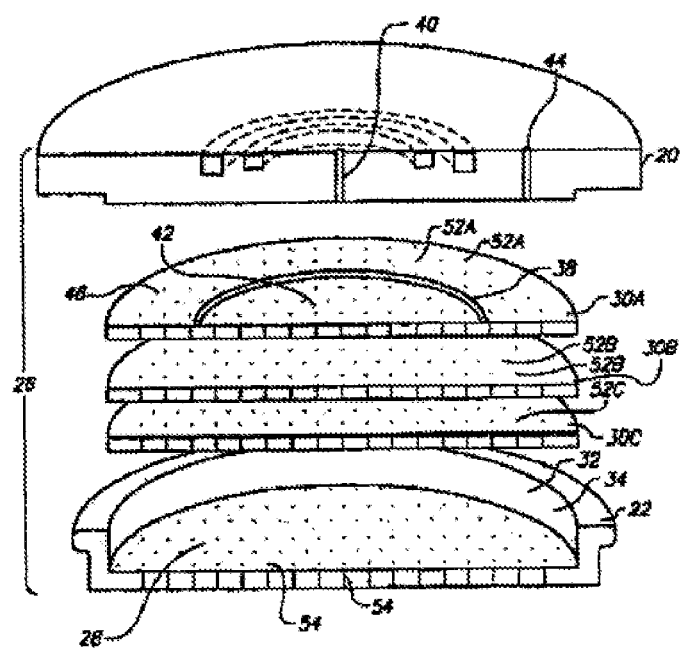
FIG. 3 is a schematic structural exploded view of a gas distribution device.

FIG. 3 is a schematic structural exploded view of a gas distribution device. With reference to FIG. 3, the gas distribution device 26 includes a support plate 20 located at an upper position and a spray head electrode 22 located at a lower position, which are assembled together to form a gas distribution chamber. In order to make the gas flow distribution more uniform, a choked flow assembly is arranged in the above-mentioned gas distribution chamber, which includes one or more choked flow plates (30A, 30B, 30C, . . . ). The gas distribution device may be particularly suitable for a dual-zone (dual-path) gas inlet system. A first path gas (i.e., a central zone gas) may enter the device through the central gas inlet pipeline 40 arranged on a support plate 20. A second-path gas (i.e., gas in an edge area) may enter the device from an edge gas inlet channel 44 arranged on the support plate 20. In the choked flow plate 30A closest to the support plate 20, a central area 42 and an edge area 46 are separated by a seal ring 38. Thus, the first path gas may enter the central area 42 of the gas distribution chamber, and the second path gas may enter the edge area 46 of the gas distribution chamber. A uniform gas distribution may be obtained ultimately at a backside 28 of the spray head electrode 22. Then, the gas uniformly distributed here may enter the reaction chamber through the spray head electrode 22 (an upper electrode of the semiconductor etching apparatus) and form a uniform gas distribution above the processed wafer in the reaction chamber. In addition, gas hole channels 52A, 52B, 52C, 54, etc., which are substantially perpendicular to the upper and lower surfaces, are evenly distributed on the above-mentioned choked flow assembly and the spray head electrode 22.

The gas distribution chamber 90 shown in FIG. 2 is configured to cause the process gas to uniformly enter the reaction chamber 94. The gas distribution device shown in FIG. 3 can achieve the purpose of uniform gas diffusion by distributing the gas through four layers of sieve plates with holes. It can be seen that the gas distribution chamber 90 shown in FIG. 2 and the gas distribution device shown in FIG. 3 are mainly configured to distribute the process gas uniformly, but neither can reduce the energy density of the plasma.

First Embodiment

Figure 4:
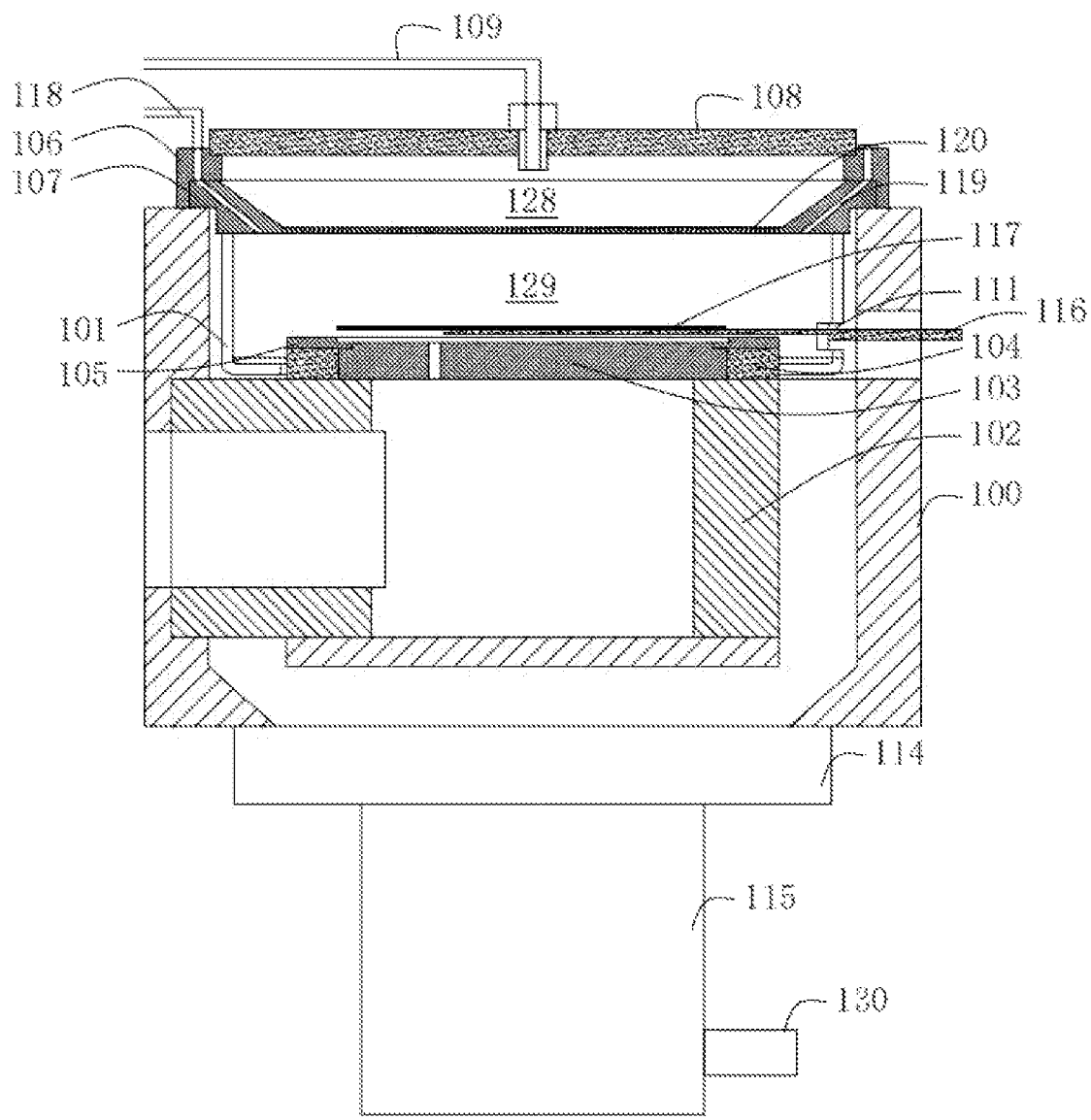
FIG. 4 is a schematic structural diagram of a semiconductor reaction chamber according to a first embodiment of the present disclosure.

With reference to FIG. 4, the present embodiment provides a semiconductor reaction chamber, including a dielectric window 108, a reaction chamber body 100, a spray head 107, and a process reaction gas inlet member 106. The material of the dielectric window 108 may be a ceramic material or a quartz material. The dielectric window 108 is arranged above the reaction chamber body 100. The plasma generation area is below the dielectric window 108. In addition, a central nozzle system 109 is arranged on the dielectric window 108 and configured to introduce a plasma generation gas (such as argon) into the above-mentioned plasma generation area. In addition, a chamber body 100 includes a base 103 configured to carry a wafer 117. The base 103 may be, for example, an electrostatic chuck. The electrostatic chuck is arranged in the reaction chamber body 100 through the electrostatic chuck base 102.

Figure 5A:
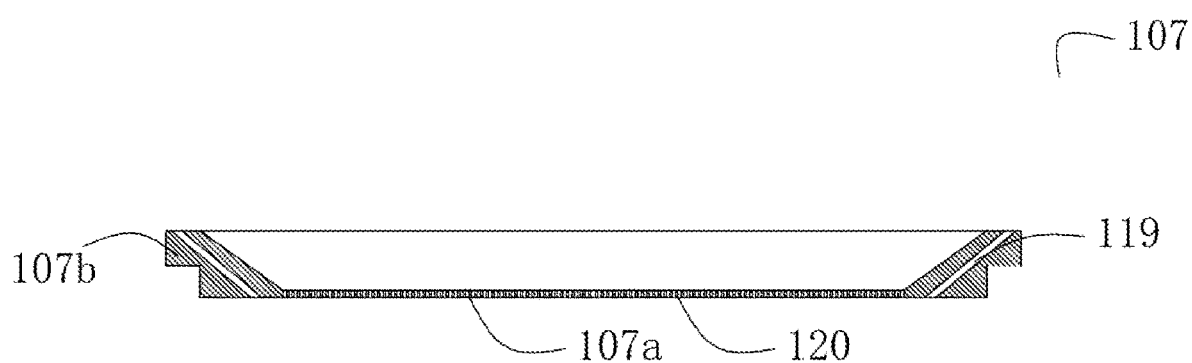
FIG. 5A is a schematic cross-section diagram of a spray head according to a first embodiment of the present disclosure.
Figure 5B:
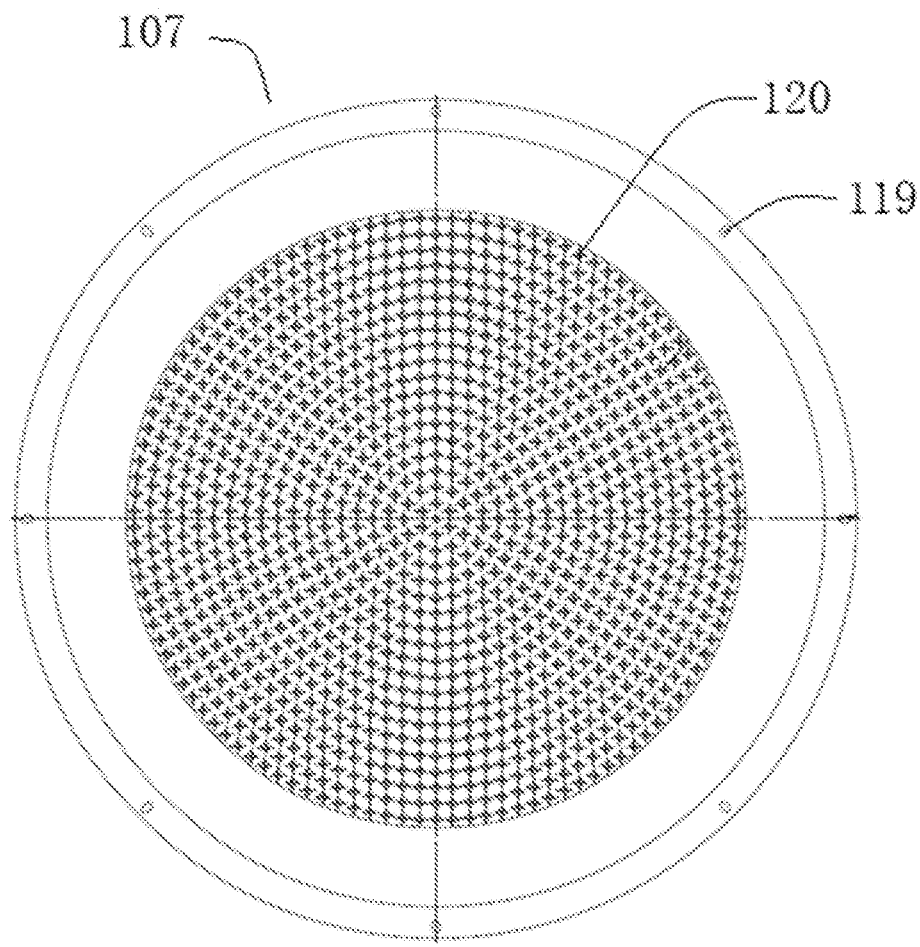
FIG. 5B is a schematic top view of a spray head according to a first embodiment of the present disclosure.

With reference to FIG. 5A and FIG. 5B together, the spray head 107, for example, is made of a metal material. The spray head 107 is arranged between the dielectric window 108 and a top wall of the reaction chamber body 100 and divides the above-mentioned plasma generation area into an strong plasma area 128 at an upper part and a weak plasma area 129 at a lower part. The strong plasma area 128 may facilitate plasma ignition. In addition, a plurality of through-holes 120 are distributed in the central area of the spray head 107 and configured to allow the plasma in the strong plasma area 128 to pass through. The through-holes 120 can reduce the energy of the plasma, which enters the through-holes 120 from the strong plasma area 128. Thus, the plasma entering the weak plasma area 129 may be a plasma with low energy density, which can provide a plasma source with the low energy for etching processes, such as plasma etching or atomic layer etching. The plasma damage may be reduced. Especially when microstructures with little or no space are processed, the microstructures on the wafer may be prevented from being damaged. In addition, with the aid of the first gas channel in the edge area of the spray head and the second gas channel in the process reaction gas inlet member, an input channel configured to introduce the process reaction gas into the weak plasma area alone may be formed. Thus, the gas can be controlled and input fast and precisely to satisfy gas fast control requirement of the atomic layer etching process.

As shown in FIG. 4, the first gas channel is arranged in the edge area of the spray head 107. A gas outlet end of the first air channel is communicated with the weak plasma area 129. The process reaction gas inlet member 106 is located on a side where the inlet end of the first channel of the spray head 107 is located. The second gas channel is arranged in the process reaction gas inlet member 106. The second gas channel may be configured to introduce the process reaction gas (such as chlorine) into the first gas channel. With the aid of the first gas channel in the edge area of the spray head 107 and the second gas channel in the process reaction gas inlet member 106, an input channel configured to introduce the process reaction gas into the weak plasma area 128 alone can be formed, which can realize rapid and precise control and input of the gas to satisfy the gas rapid control requirements of the atomic layer etching process.

In some embodiments, as shown in FIG. 5A and FIG. 5B, the above-mentioned first gas channel includes a plurality of gas holes 119 distributed at intervals along a circumferential direction of the spray head 107, which are configured to uniformly distribute the process reaction gas. Further, in some embodiments, in order to facilitate the communication between the gas inlet end of the gas hole 119 and the gas outlet end of the above-mentioned second gas channel, the gas outlet end of the gas hole 119 is communicated with the weak plasma area 128. Each gas hole 119 is arranged obliquely, that is, an axis of each gas hole 119 forms an included angle with an axis of the reaction chamber body 100. The gas outlet end of the gas hole 119 may be closer to the axis of the reaction chamber body 100 than the gas inlet end.

The above-mentioned spray head 107 may have various structures. For example, as shown in FIG. 5A and FIG. 5B, the spray head 107 includes a circular plane member 107a and an annular member 107b connected to the spray head 107 and surrounding the circular plane member 107a. The circular plane member 107a is in a circular disk shape. The plurality of through-holes 120 are evenly distributed on the circular plane member 107a, for example, uniformly distributed on the circular plane member 107a in a concentric circle manner. In some embodiments, the axis of the through-hole 120 is perpendicular to the plane where the circular plane member 107a is located. The plurality of gas holes 119 are distributed at intervals along the circumferential direction of the annular member 107b.

In some embodiments, optionally, a thickness of the annular member 107b may be greater than the thickness of the circular plane member 107a. A lower surface of the annular member 107b may be flush with a lower surface of the circular plane member 107a. The annular member 107b may be located on an inner side of the reaction chamber body 100. An annular flange may be arranged surrounding an outer peripheral wall of the annular member 107b. The annular flange may be stacked at the top of the reaction chamber body 100 to realize the fixed connection between the annular member 107b and the reaction chamber body 100. The gas inlet end of each gas hole 119 may be located on the upper surface of the above-mentioned annular flange. The gas outlet end of each gas hole 119 is located on the lower surface of the annular member 107b, which facilitates the communication between the gas inlet end of the gas hole 119 and the gas outlet end of the second gas channel. The gas outlet end of the gas hole 119 may be communicated with the weak plasma area 128.

It should be noted that, in the present embodiment, one circular plane member 107a may be included. However, embodiments of the present disclosure are not limited to this. In practical applications, a plurality of circular plane members 107a may be provided and be stacked with each other.

In some embodiments, a diameter of a through-hole 120 may range from φ1 mm to φ10 mm, preferably φ4 mm. A porosity of the circular plane member 107a may range from 10% to 80%, preferably 60%. By setting the diameter of the through-hole 120 and the porosity of the circular plane member 107a within the above two ranges, the plasma entering the weak plasma area 129 may be guaranteed to be the low energy density plasma. Of course, in practical applications, the diameter of the through-hole 120 and the porosity of the circular plane member 107a can be freely set according to parameters such as a gas flow rate of the spray head 107 and a plasma ignition pressure.

In some embodiments, the diameter of the gas hole 119 can be set to range from φ1 mm to φ8 mm. In some embodiments, a nozzle can be arranged at the gas hole 119. The diameter of the nozzle may range, for example, from φ1 mm to φ5 mm. In some embodiments, a number of the gas holes 119 may be 8, and the diameter of the gas hole 119 may be set to φ4 mm.

In some embodiments, optionally, a vertical distance between the upper surface of the circular plane member 107a of the spray head 107 and the lower surface of the dielectric window 108 may range from 20 mm to 200 mm, preferably from 40 mm to 100 mm. A vertical distance between the lower surface of the circular flat member 107a of the spray head and the upper surface of the wafer placed on the base 103 may range from 20 mm to 100 mm, preferably from 30 mm to 80 mm. For example, the vertical distance between the upper surface of the circular plane member 107a of the spray head 107 and the lower surface of the dielectric window 108 may be 60 mm. The lower surface of the circular plane member 107a of the spray head and the upper surface of the wafer on the base 103 may be 40 mm.

In some embodiments, optionally, the above-mentioned process reaction gas inlet member 106 may be a gas distribution and support ring. The gas distribution and support ring may mainly include two functions, first, being used as a support member for the dielectric window 108 and forming a chamber inside, and second, being used as a gas distribution mechanism to cause the process reaction gas to enter the above-mentioned first gas channel through the second gas channel. In some embodiments, at least a part of the gas distribution and support ring may be stacked on the upper surface of the spray head 107 and correspond to the plurality of gas holes 119. A plurality of gas outlet ends of the above-mentioned second gas channel may be provided and located on a surface of the gas distribution and support ring that contacts the upper surface of the spray head 107 and communicated with the gas inlet ends of the plurality of gas holes 119 in a one-to-one correspondence to communicate the second gas channel with the first gas channel.

Figure 6A:
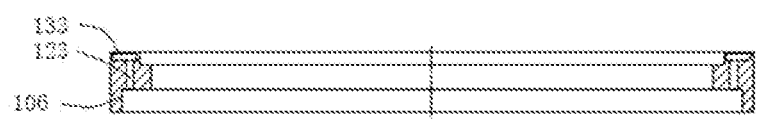
FIG. 6A is a schematic cross-section diagram of a gas inlet member of a process reaction gas according to a first embodiment of the present disclosure.
Figure 6B:
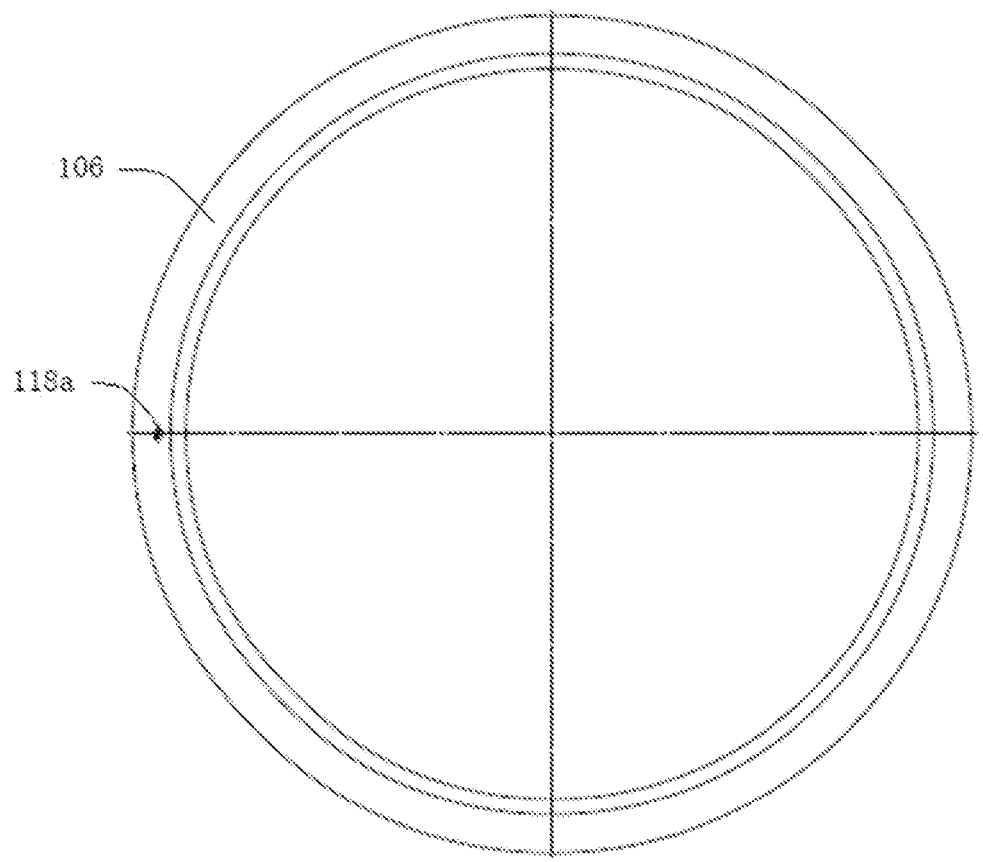
FIG. 6B is a schematic top view of a gas inlet member of a process reaction gas according to a first embodiment of the present disclosure.

In some embodiments, optionally, with reference to FIG. 6B, one gas inlet end 118a of the second gas channel has one gas inlet end 118a, which is located on the upper surface of the gas distribution and support ring and configured to be communicated with the gas inlet pipeline 118. As shown in FIG. 6A, the second gas channel includes a plurality of arc-shaped sub-gas channel groups that are concentric with the above-mentioned gas distribution and support ring and have different radii and a plurality of lower outlets 123. A plurality of arc-shaped sub-gas channel groups may be communicated in sequence. In two communicated arc-shaped sub-gas channel groups, a number of arc-shaped sub-gas channels in a downstream arc-shaped sub-gas channel group may be two times a number of arc-shaped sub-gas channels in an upstream arch-shaped sub-gas channel group. Thus, a path process reaction gas entering arc-shaped sub-gas channels of a most upstream arc-shaped sub-gas channel group from the gas inlet ends 118a of the second gas channel may be divided into a plurality of sub-paths on average by a corresponding number of arc-shaped sub-gas channels in the plurality of downstream arc-shaped sub-gas channel groups in sequence. That is, a path process reaction gas may be first divided into two sub-paths, and the two paths may be then divided into four sub-paths, and so on. A number of the gas outlet ends of the arc-shaped sub-gas channels of the most downstream arc-shaped sub-gas channel group may have a same number of the gas holes 119. The gas outlet ends may be communicated with the gas holes 119 through the plurality of lower outlets 123 in a one-to-one correspondence.

Figure 7:
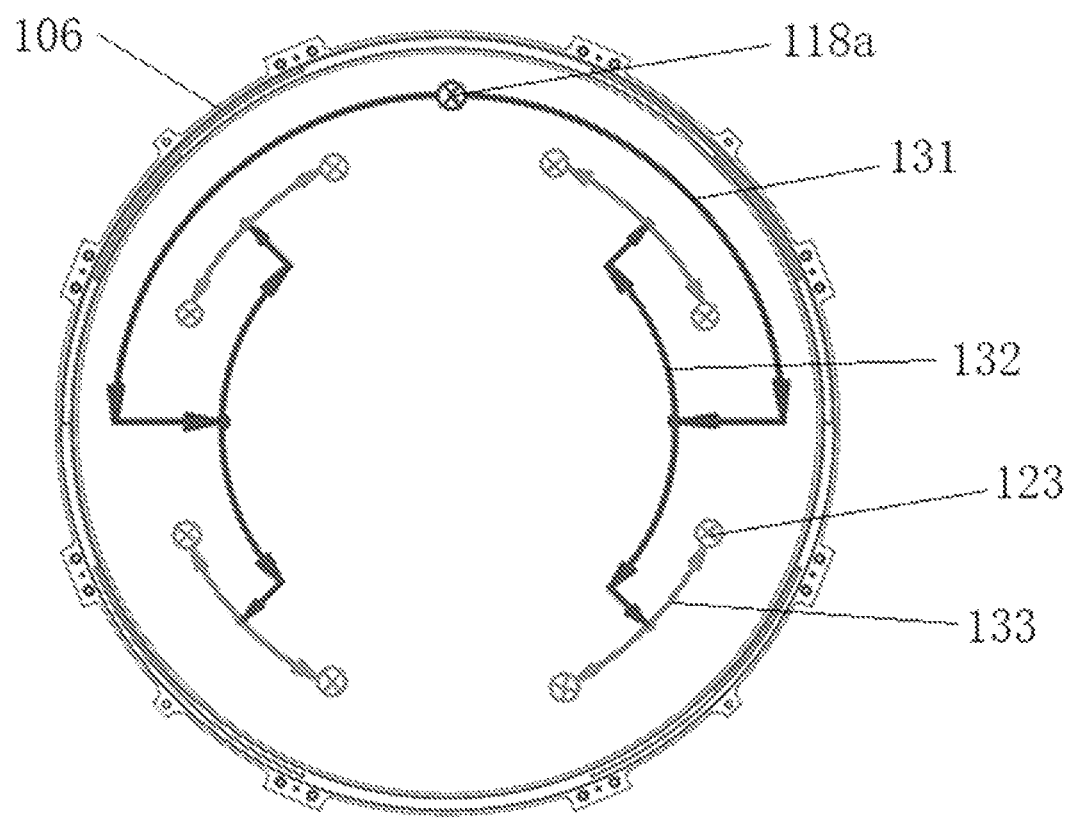
FIG. 7 is a schematic internal structural diagram of a gas inlet member of a process reaction gas according to a first embodiment of the present disclosure.

For example, as shown in FIG. 6A and FIG. 7, three arc-shaped sub-gas channel groups are included and include a first arc-shaped sub-gas channel group 131, a second arc-shaped sub-gas channel group 132, and a third arc-shaped sub-gas channel group 133 in a gas inlet direction. The radius of the third arc-shaped sub-gas channel group 133 may be greater than the radius of the second arc-shaped sub-gas channel group 132 and smaller than the radius of the first arc-shaped sub-gas channel group 131. In addition, the first arc-shaped sub-gas channel group 131 may include an arc-shaped sub-gas channel. The second arc-shaped sub-gas channel group 132 may include two centrally symmetric arc-shaped sub-gas channels. The third arc-shaped sub-gas channel group 133 may include four centrally symmetric arc-shaped sub-gas channels. Each arc-shaped sub-gas channel may include one gas inlet end and is located in the middle position. Each arc-shaped sub-gas channel may include two gas outlet ends and located at two ends. Specifically, the inlet end of the arc-shaped sub-gas channel of the first arc-shaped sub-gas channel group 131 at the middle position may be used as the gas inlet end 118a of the second gas channel and may be communicated with the gas inlet pipeline 118. The two gas outlet ends of the arc-shaped sub-gas channel at both ends may be communicated with the gas inlet ends of the two arc-shaped sub-gas channels in the second arc-shaped sub-gas channel group 132 at the middle position, respectively. The two gas outlet ends of the two arc-shaped sub-gas channels at both ends may be communicated with the gas inlet ends of the four arc-shaped sub-gas channels in the third arc-shaped sub-gas channel group 133 at the middle position. As shown in FIG. 6A, the two gas outlet ends located at the two ends of the four arc-shaped sub-gas channels are all communicated with the lower outlets 123. Thus, the one path process reaction gas can be evenly divided into the plurality of sub-paths, and the gas flow paths of the sub-paths can be guaranteed to be the same. Thus, the process reaction gas in the sub-paths can reach the lower outlets 123 simultaneously. In some embodiments, a number of the lower outlets 123 may be 4 to 12. Thus, the one path process reaction gas may be divided into 4 to 12 portions correspondingly.

In some embodiments, optionally, surface processing such as anti-plasma spray may be performed on a surface of the part in contact with the plasma. For example, for an aluminum material, surface oxidation processing and yttrium oxide spray processing may be required.

Second Embodiment

Figure 8:
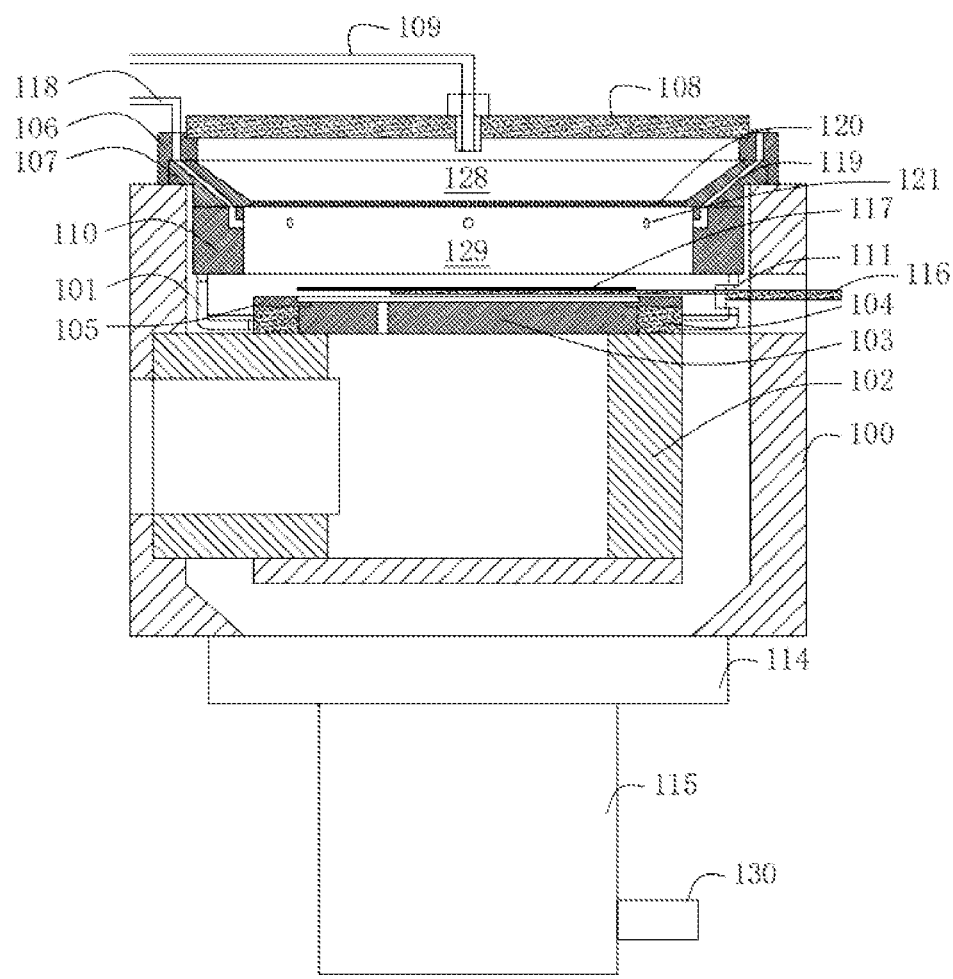
FIG. 8 is a schematic structural diagram of a semiconductor reaction chamber according to a second embodiment of the present disclosure.

With reference to FIG. 8, the semiconductor reaction chamber of the present embodiment, compared with the above-mentioned first embodiment, also includes a dielectric window 108, a reaction chamber body 100, a spray head 107, and a process reaction gas inlet member 106. Since the structures and functions of these components have been described in detail in the above-mentioned first embodiment, the structures and functions of these components are not repeated here. Only the differences between the semiconductor reaction chambers provided in the present embodiment and the above-mentioned first embodiment are described in detail below.

Figure 9A:
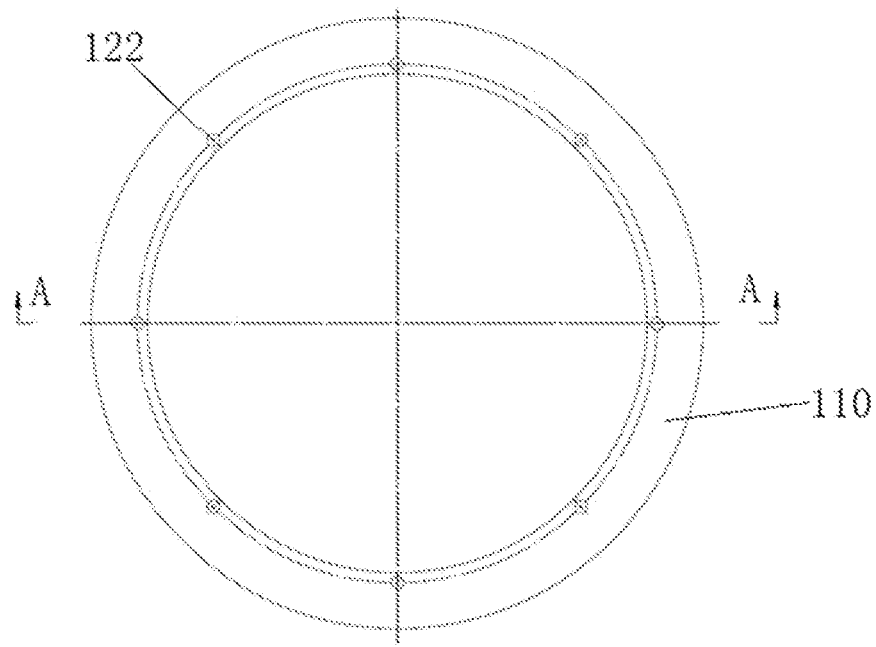
FIG. 9A is a schematic top view of a gas distribution ring according to a second embodiment of the present disclosure.
Figure 9B:
FIG. 9B is a schematic cross-section diagram along line A-A in FIG. 9.
Figure 9C:
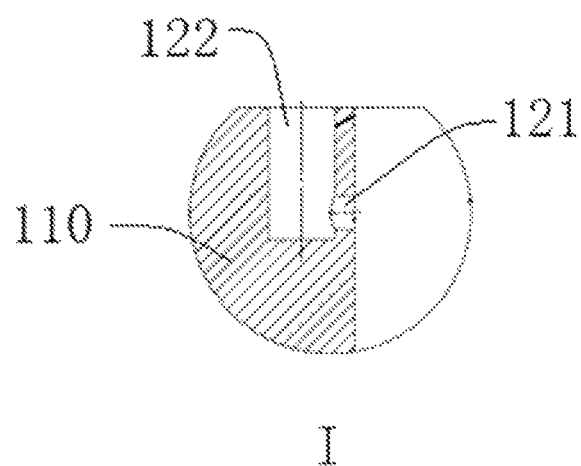
FIG. 9C is a schematic enlarged view of an area I in FIG. 9B.

Specifically, the semiconductor reaction chamber further includes a gas distribution ring 110. The gas distribution ring 110 is arranged around below the spray head 107. As shown in FIG. 9A to FIG. 9C, a plurality of third gas channels are arranged at intervals along a circumferential direction in the gas distribution ring 110. The gas inlet ends of the third gas channels are communicated with the gas outlet ends of the gas holes 119 in a one-to-one correspondence. The gas outlet ends of the gas holes 119 may be communicated with the weak plasma area 129 through the above-mentioned third gas channels. The third gas channel may include a plurality of structures. For example, as shown in FIG. 9C, a third gas channel includes a first through-hole 122 arranged along an axial direction of the gas distribution ring 110 and a second through-hole 121 arranged along a radial direction of the gas distribution ring 110. The gas inlet end of the first through-hole 122 may be used as the gas inlet end of the third gas channel and located on an upper surface of the gas distribution ring 110. The gas outlet end of the first through-hole 122 may be communicated with the gas inlet end of the second through-hole 121. The gas outlet end of the second through-hole 121 may be used as the gas outlet end of the third gas channel and located on an inner sidewall of the gas distribution ring 110.

In some embodiments, a spray head may be arranged at the third gas channel. A diameter of the spray head may be, for example, φ2 mm.

On one hand, the gas distribution ring 110 may be configured to uniformly and controllably transfer the process reaction gas to the weak plasma area 129. On another hand, the gas distribution ring 110 may fill the inner chamber of the reaction chamber body 100. The weak plasma area 129 may be formed and enclosed by the spray head 107, the gas distribution ring 110, and the base 103. Compared with the conventional reaction chamber body 100, the volume of the weak plasma area 129 may be greatly reduced, which is beneficial to reduce gas flow retention time, improve switching efficiency of etching processing and auxiliary time, and provide a hardware basis for atomic layer plasma etching.

For example, the gas distribution ring 110 may be located inside the above-mentioned reaction chamber body 100 and be stacked on the lower surface of the annular member 107b of the spray head 107.

It should be noted that, in the present embodiment, the second through-hole 121 may be arranged along the radial direction of the gas distribution ring 110. However, embodiments of the present disclosure are not limited to this. In practical applications, the second through-hole 121 may also have a predetermined included angle with the axial direction of the reaction chamber body 100 to obtain a desired gas inlet direction.

It should also be noted that, in the present embodiment, the third gas channel may include the first through-hole 122 and the second through-hole 121. However, embodiments of the present disclosure are not limited to this. In practical applications, the third gas channel may also be a through-hole that is inclined and has a predetermined angle with the axial direction of the reaction chamber body 100 or any other structure.

Structures and functions of other components of the present embodiment may be same as those of the above-mentioned first embodiment. Since the structures and functions of the other components are described in detail the above-mentioned first embodiment, the structures and functions of the other components will not be repeated here.

In the above-mentioned first and second embodiments, optionally, the semiconductor reaction chamber may further include a focus ring 105 and a liner 101. The focus ring 105 may be arranged outside the base 103 (e.g., an electrostatic chuck) and configured to protect the lower components. The liner 101 may be arranged between the gas distribution ring 110 and the base 103 and around the inner wall of the reaction chamber body 100 to prevent the etching reaction product from contaminating the reaction chamber. The lower part and the side part of the liner 101 may be provided with grid holes to facilitate the gas flow.

In some embodiments, the semiconductor reaction chamber may further include a base ring 104. The base ring 104 may be arranged around the base 103. The focus ring 105 may be arranged on the base ring 104.

In addition, a opening 111 may be arranged on the liner 101 and the reaction chamber body 100 and configured to transfer the wafer 117. The opening 111 may be provided with an inner door (the gap is closed after the transfer is completed). When the wafer 117 is transferred, the inner door may be opened. After the wafer 117 is loaded on the electrostatic chuck, the inner door is closed to form a plasma area in a sealed area. The transfer of the wafer 117 between the transfer platform and the semiconductor reaction chamber can be achieved by a vacuum manipulator 116.

In summary, in the semiconductor reaction chambers of embodiments of the present disclosure, the plasma generation area may be divided into the strong plasma area at the upper part and the weak plasma area at the lower part through the spray head. The plurality of through-holes distributed at the middle area in the spray head may be configured to reduce the energy of the plasma that enters the through-holes from the strong plasma area. Thus, the plasma that enters the weak plasma area may be the plasma with low energy density to provide the low energy plasma source for the etching processes of the plasma etching or atomic layer etching and reduce the plasma damage. Especially, when the microstructure with little or no space is processed, the microstructures on the wafer may be prevented from being damaged. In addition, with the aid of the first gas channel in the edge area of the spray head and the second gas channel in the process reaction gas inlet member, an input channel is configured to introduce the process reaction gas into the weak plasma area alone. Thus, the rapid and precise control and input of the gas may be achieved, which satisfies the gas rapid control requirement of the atomic layer etching process.

Third Embodiment

The present embodiment provides an atomic layer plasma etching apparatus. The plasma etching apparatus can be configured to complete conventional low-density plasma etching processing and perform atomic layer etching processing in combination with the principle of atomic layer etching.

Figure 10:
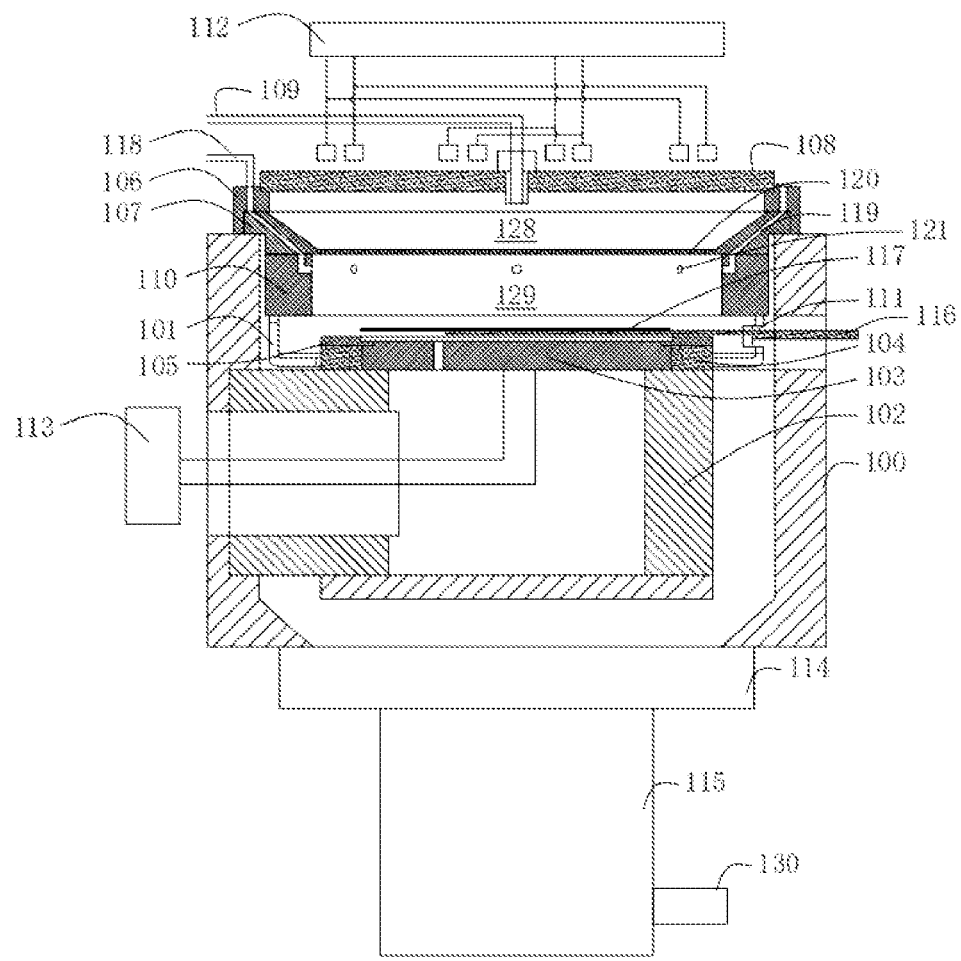
FIG. 10 is a schematic structural diagram of an atomic layer plasma etching apparatus according to a third embodiment of the present disclosure.

With reference to FIG. 10, the plasma etching apparatus includes a semiconductor reaction chamber, an upper radio frequency system 112, and a lower radio frequency system 113. The above-mentioned semiconductor reaction chamber is the semiconductor reaction chamber of embodiments of the present disclosure. A base 103 configured to carry a wafer is arranged in the semiconductor reaction chamber. The semiconductor reaction chamber includes a reaction chamber body 100, and a process reaction gas inlet member 106 and a dielectric window 108 that are sequentially stacked on the top of the reaction chamber body 100 along the direction away from the reaction chamber body 100. In addition, the spray head 107 is arranged between the dielectric window 108 and the top wall of the reaction chamber body 100 and located on an inner side of the above-mentioned process reaction gas inlet member 106. In some embodiments, the gas distribution ring 110 is arranged around below the spray head 107.

In addition, a central nozzle system 109 may be arranged on the dielectric window 108 and configured to introduce the plasma generation gas into the plasma generation area. The upper radio frequency system 112 may be arranged above the dielectric window 108 and configured to excite the plasma generation gas to form the plasma. The lower radio frequency system 113 may be electrically connected to the base 103 and configured to load bias power. For example, the upper radio frequency system 112 may be configured to provide a high-frequency power supply and ionize the gas to generate the plasma. The lower radio frequency system 113 may apply the bias power to the base 103, which can accelerate the plasma to move toward the surface of the wafer 117 to realize the plasma etching processing of the wafer 117. A pressure control valve 114 and a vacuum pump system 115 may be arranged at the lower portion of the reaction chamber body 100 and configured to control the pressure and evacuation in the reaction chamber body 100. The vacuum pump system 115 may include a gas exhaust opening 130 configured to exhaust the gas.

In addition, a opening 111 may be arranged on the liner 101 and the reaction chamber body 100 and configured to transfer the wafer 117. The opening 111 may be provided with an inner door (the opening 111 is closed after the transfer is completed). When the wafer 117 is transferred, the inner door may be opened. After the wafer 117 is loaded on the base 103, the inner door may be closed to form a plasma area in a sealed area. The transfer of the wafer 117 between the transfer platform and the reaction chamber may be achieved by a vacuum manipulator 116.

The main process of performing the atomic layer etching using the above-mentioned plasma etching apparatus includes as follows.

1) The process reaction gas provided by the gas inlet pipeline 118 enters the second channel of the process reaction gas inlet member 106. After being evenly distributed in the second channel, the process gas flows into the third channel of the gas distribution ring 110 through the gas holes 119 of the spray head 107 and flows into the weak plasma area 129 through the third channels. A layer of gas that can react with the to-be-etched material (remove) chemically may be absorbed in the to-be-etched surface (without mask) of the wafer 117. The reaction occurs to form the reaction product. The includes but is not limited to chlorine gas, tetrafluorocyclobutane, etc.

2) The remaining excessive process reaction gas is pumped out by the vacuum pump system 115.

3) The plasma generation gas (e.g., argon) is transferred into the strong plasma area 128 through the central nozzle system 109 arranged on the dielectric window 108. The pressure control valve 114 controls the pressure in the reaction chamber body 100, the upper radio frequency system 112 feeds the high-frequency radio frequency power, and the ionized gas is ignited to generate a high-density strong plasma. Through a high vacuum function of the vacuum pump system 115, a part of the plasma is driven to move from the strong plasma area 128 to the weak plasma area 129. The plasma bombards the unmasked surface of the wafer 117. The wafer reacts with the etching process gas to generate the reaction product. The reaction product is stripped off.

4) The vacuum pump system 115 is configured to pump all the gases and reaction products in the reaction chamber body 100 out of the reaction chamber body 100. By making the above four steps as one cycle, the material of the atomic layer thickness of the etched material may be removed by one cycle. The predetermined target material etching is realized through a plurality of cycles.

It should be noted that, in the atomic layer plasma etching apparatus provided in the present embodiment, the semiconductor reaction chamber may be the semiconductor reaction chamber of the first embodiment or the second embodiment of the present disclosure.

The atomic layer plasma etching apparatus of embodiments of the present disclosure can provide the low-energy plasma source, reduce plasma damage, and realize rapid and precise control and input of the gas through the semiconductor reaction chamber of various embodiments of the present disclosure. Thus, the gas rapid control requirement of the atomic layer etching process may be satisfied.

Various embodiments of the present disclosure have been described above, and the above descriptions are exemplary, not exhaustive, and not limited the disclosed embodiments. Modifications and variations may be apparent to those of ordinary skill in the art without departing from the scope and spirit of the described embodiments. The terminology used herein is chosen to best explain the principles of the embodiments, the practical applications, or technical improvements in the marketplace or to enable those of ordinary skill in the art to understand the various embodiments disclosed herein.

What is claimed is:

1. A semiconductor reaction chamber comprising:
    a reaction chamber body;
    a dielectric window arranged above the reaction chamber body, a plasma generation area being located below the dielectric window;
    a spray head arranged between the dielectric window and a top wall of the reaction chamber body and dividing the plasma generation area into a strong plasma area at an upper part and a weak plasma area at a lower part, the spray head being arranged at the dielectric window to introduce plasma generating gas into the strong plasma area, a plurality of through-holes being distributed in a central area of the spray head and configured to allow a plasma in the strong plasma area to pass through, an edge area of the spray head being provided with a first gas channel, and a gas outlet end of the first gas channel being communicated with the weak plasma area; and
    a process reaction gas inlet member located on a side where a gas inlet end of the first gas channel of the spray head is located, a second gas channel being arranged in the process reaction gas inlet member, and the second gas channel being configured to introduce a process reaction gas into the weak plasma area; wherein the process reaction gas is different from the plasma generating gas.

2. The semiconductor reaction chamber according to claim 1, wherein:
    the first gas channel includes a plurality of gas holes arranged at intervals along a circumferential direction of the spray head; and
    the process reaction gas inlet member is a gas distribution and support ring, at least a part of the gas distribution and support ring being stacked on an upper surface of the spray head, and a plurality of gas outlet ends of the second gas channel being provided, located on a surface of the gas distribution and support ring that contacts with the upper surface of the spray head, and communicated with gas inlet ends of the plurality of gas holes in a one-to-one correspondence.

3. The semiconductor reaction chamber according to claim 2, wherein the second gas channel includes:
    one gas inlet end located on an upper surface of the gas distribution and the support ring;
    a plurality of arc-shaped sub-gas channel groups concentric with the gas distribution and the support ring, having different radii, and communicated in sequence, in two communicated arc-shaped sub-gas channel groups, a number of arc-shaped sub-gas channels of a downstream arc-shaped sub-gas channel group being two times of a number of arc-shaped sub-gas channels of an upstream arc-shaped sub-gas channel group; and
    a plurality of lower outlets, a number of gas outlet ends of arc-shaped sub-gas channels of a most downstream arc-shaped sub-gas channel group being the same as a number of the gas holes, the gas outlet ends being communicated with the gas holes in a one-to-one correspondingly through the lower outlets.

4. The semiconductor reaction chamber according to claim 3, wherein, in a gas inlet direction, the second gas channel includes:
    a first arc-shaped sub-gas channel group including one arc-shaped sub-air channel;
    a second circular arc-shaped sub-gas channel group including two arc-shaped sub-gas channels that are center symmetrical; and a third circular arc-shaped sub-gas channel group including four arc-shaped sub-gas channels that are center symmetrical, a radius of the third arc-shaped sub-gas channel group being larger than a radius of the second arc-shaped sub-gas channel group and smaller than a radius of the first arc-shaped sub-gas channel group, each of the arc-shaped sub-gas channels including one gas inlet end that is located in a middle position, and each of the arc-shaped sub-gas channels including two gas outlet ends that are located at two ends.

5. The semiconductor reaction chamber according to claim 2, wherein the semiconductor reaction chamber further includes:
a gas distribution ring arranged around below the spray head, and a plurality of third gas channels being arranged in the gas distribution ring at intervals along a circumferential direction of the gas distribution ring, and gas inlet ends of the third gas channels being communicated with the gas outlet ends of the gas holes in a one-to-one correspondence, and the gas outlet ends of the gas holes being communicated with the weak plasma area through the third gas channels.

6. The semiconductor reaction chamber according to claim 5, wherein:
a gas inlet end of each of the third gas channels is located on an upper surface of the gas distribution ring;
a gas outlet end of each of the third gas channels is located on an inner sidewall of the gas distribution ring; and
a gas outlet direction of the gas outlet end of each of the third gas channels is perpendicular to an axial direction of the reaction chamber body or forms a predetermined angle with the axial direction of the reaction chamber body.

7. The semiconductor reaction chamber according to claim 5, wherein the spray head includes:
a circular plane member, a plurality of through-holes being evenly distributed in the circular plane member; and
an annular member connected to the spray head and surrounding the circular plane member, a plurality of gas holes being distributed at intervals along a circumferential direction of the annular member.

8. The semiconductor reaction chamber according to claim 7, wherein a plurality of the circular plane members are included and stacked with each other.

9. The semiconductor reaction chamber according to claim 7, wherein:
a thickness of the annular member is greater than a thickness of the circular plane member; and
a lower surface of the annular member is flush with a lower surface of the circular plane member;
the annular member is located on an inner side of the reaction chamber body;
an annular flange is arranged around an outer peripheral wall of the annular member and stacked on a top of the reaction chamber body, a gas inlet end of each of the gas holes being located on an upper surface of the annular flange, and a gas outlet end of each of the gas holes being located on a lower surface of the annular member; and
the gas distribution ring is located on the inner side of the reaction chamber body and stacked on the lower surface of the annular member.

10. The semiconductor reaction chamber according to claim 7, wherein:
a diameter of the through-hole ranges from φ1 mm to φ10 mm;
a porosity of the circular plane member ranges from 10% to 80%; and
a diameter of the gas hole ranges from φ1 mm to φ8 mm.

11. An atomic layer plasma etching apparatus comprising:
a semiconductor reaction chamber including:
a reaction chamber body;
a dielectric window arranged above the reaction chamber body, a plasma generation area being located below the dielectric window;
a spray head arranged between the dielectric window and a top wall of the reaction chamber body and dividing the plasma generation area into an strong plasma area at an upper part and a weak plasma area at a lower part, the spray head being arranged at the dielectric window to introduce plasma generating gas into the strong plasma area, a plurality of through-holes being distributed in a central area of the spray head and configured to allow a plasma in the strong plasma area to pass through, an edge area of the spray head being provided with a first gas channel, and a gas outlet end of the first gas channel being communicated with the weak plasma area; and
a process reaction gas inlet member located on a side where a gas inlet end of the first gas channel of the spray head is located, a second gas channel being arranged in the process reaction gas inlet member, and the second gas channel being configured to introduce a process reaction gas into the weak plasma area;
wherein the process reaction gas is different from the plasma generating gas;
a base configured to carry a wafer and arranged in the semiconductor reaction chamber; and
a center nozzle system arranged on the dielectric window and configured to introduce a plasma generation gas into the plasma generation area;
an upper radio frequency system arranged above the dielectric window and configured to excite the plasma generation gas to form the plasma; and
a lower radio frequency system electrically connected to the base and configured to load bias voltage power.

12. The atomic layer plasma etching apparatus according to claim 11, wherein:
the first gas channel includes a plurality of gas holes arranged at intervals along a circumferential direction of the spray head
the process reaction gas inlet member is a gas distribution and support ring, at least a part of the gas distribution and support ring being stacked on an upper surface of the spray head, and a plurality of gas outlet ends of the second gas channel being provided, located on a surface of the gas distribution and support ring that contacts with the upper surface of the spray head, and communicated with gas inlet ends of the plurality of gas holes in a one-to-one correspondence.

13. The atomic layer plasma etching apparatus according to claim 12, wherein the second gas channel includes:
one gas inlet end located on an upper surface of the gas distribution and the support ring;
a plurality of arc-shaped sub-gas channel groups concentric with the gas distribution and the support ring, having different radii, and communicated in sequence, in two communicated arc-shaped sub-gas channel groups, a number of arc-shaped sub-gas channels of a downstream arc-shaped sub-gas channel group being two times of a number of arc-shaped sub-gas channels of an upstream arc-shaped sub-gas channel group; and a plurality of lower outlets, a number of gas outlet ends of arc-shaped sub-gas channels of a most downstream arc-shaped sub-gas channel group being the same as a number of the gas holes, the gas outlet ends being communicated with the gas holes in a one-to-one correspondingly through the lower outlets.

14. The atomic layer plasma etching apparatus according to claim 13, wherein, in a gas inlet direction, the second gas channel includes:
   a first arc-shaped sub-gas channel group including one arc-shaped sub-air channel;
   a second circular arc-shaped sub-gas channel group including two arc-shaped sub-gas channels that are center symmetrical; and
   a third circular arc-shaped sub-gas channel group including four arc-shaped sub-gas channels that are center symmetrical, a radius of the third arc-shaped sub-gas channel group being larger than a radius of the second arc-shaped sub-gas channel group and smaller than a radius of the first arc-shaped sub-gas channel group, each of the arc-shaped sub-gas channels including one gas inlet end that is located in a middle position, and each of the arc-shaped sub-gas channels including two gas outlet ends that are located at two ends.

15. The atomic layer plasma etching apparatus according to claim 12, wherein the semiconductor reaction chamber further includes:
   a gas distribution ring arranged around below the spray head, and a plurality of third gas channels being arranged in the gas distribution ring at intervals along a circumferential direction of the gas distribution ring, and gas inlet ends of the third gas channels being communicated with the gas outlet ends of the gas holes in a one-to-one correspondence, and the gas outlet ends of the gas holes being communicated with the weak plasma area through the third gas channels.

16. The atomic layer plasma etching apparatus according to claim 15, wherein:
   a gas inlet end of each of the third gas channels is located on an upper surface of the gas distribution ring;
   a gas outlet end of each of the third gas channels is located on an inner sidewall of the gas distribution ring; and
   a gas outlet direction of the gas outlet end of each of the third gas channels is perpendicular to an axial direction of the reaction chamber body or forms a predetermined angle with the axial direction of the reaction chamber body.

17. The atomic layer plasma etching apparatus according to claim 15, wherein the spray head includes:
   a circular plane member, a plurality of through-holes being evenly distributed in the circular plane member; and
   an annular member connected to the spray head and surrounding the circular plane member, a plurality of gas holes being distributed at intervals along a circumferential direction of the annular member.

18. The atomic layer plasma etching apparatus according to claim 17, wherein a plurality of the circular plane members are included and stacked with each other.

19. The atomic layer plasma etching apparatus according to claim 17, wherein:
   a thickness of the annular member is greater than a thickness of the circular plane member; and
   a lower surface of the annular member is flush with a lower surface of the circular plane member;
   the annular member is located on an inner side of the reaction chamber body;
   an annular flange is arranged around an outer peripheral wall of the annular member and stacked on a top of the reaction chamber body, a gas inlet end of each of the gas holes being located on an upper surface of the annular flange, and a gas outlet end of each of the gas holes being located on a lower surface of the annular member; and
   the gas distribution ring is located on the inner side of the reaction chamber body and stacked on the lower surface of the annular member.

20. The atomic layer plasma etching apparatus according to claim 17, wherein:
   a diameter of the through-hole ranges from φ1 mm to φ10 mm;
   a porosity of the circular plane member ranges from 10% to 80%; and
   a diameter of the gas hole ranges from φ1 mm to φ8 mm.

* * * * *